United States Patent [19]
Yamazaki et al.

[11] Patent Number: 5,972,105
[45] Date of Patent: Oct. 26, 1999

[54] METHOD OF FABRICATING SEMICONDUCTOR DEVICE

[75] Inventors: Shunpei Yamazaki, Tokyo; Naoto Kusumoto; Satoshi Teramoto, both of Kanagawa, all of Japan

[73] Assignee: Semiconductor Energy Laboratory Co., Ltd., Kanagawa, Japan

[21] Appl. No.: 08/528,407

[22] Filed: Sep. 14, 1995

[30] Foreign Application Priority Data

| Sep. 15, 1994 | [JP] | Japan | 6-248791 |
| Sep. 15, 1994 | [JP] | Japan | 6-248792 |
| May 6, 1995 | [JP] | Japan | 7-132901 |
| May 6, 1995 | [JP] | Japan | 7-132902 |

[51] Int. Cl.$^6$ ..................................................... C30B 1/10
[52] U.S. Cl. ............................. 117/8; 117/933; 438/388; 438/393
[58] Field of Search ................. 117/8, 933; 437/228, 437/233; 438/388, 393

[56] References Cited

U.S. PATENT DOCUMENTS

| 4,992,839 | 2/1991 | Shirai ..................................... 357/23.7 |
| 5,147,826 | 9/1992 | Liu et al. . |
| 5,275,851 | 1/1994 | Fonash et al. . |
| 5,290,712 | 3/1994 | Sato et al. .............................. 117/930 |
| 5,294,811 | 3/1994 | Aoyama .................................... 257/59 |
| 5,373,803 | 12/1994 | Noguchi et al. ......................... 117/930 |
| 5,403,772 | 4/1995 | Zhang et al. . |
| 5,426,064 | 6/1995 | Zhang et al. . |
| 5,481,121 | 1/1996 | Zhang et al. . |
| 5,488,000 | 1/1996 | Zhang et al. . |
| 5,492,843 | 2/1996 | Adachi et al. . |
| 5,501,989 | 3/1996 | Takayama et al. . |
| 5,508,533 | 4/1996 | Takemura . |
| 5,529,937 | 6/1996 | Zhang et al. . |
| 5,534,716 | 7/1996 | Takemura . |
| 5,543,352 | 8/1996 | Ohtani et al. . |
| 5,563,426 | 10/1996 | Zhang et al. . |
| 5,569,610 | 10/1996 | Zhang et al. . |
| 5,569,936 | 10/1996 | Zhang et al. . |

(List continued on next page.)

FOREIGN PATENT DOCUMENTS

| 5958821 | 4/1984 | Japan . |
| 59148322 | 8/1984 | Japan . |
| 62-81017 | 4/1987 | Japan . |
| 2-222546 | 9/1990 | Japan . |

OTHER PUBLICATIONS

S. Caune et al., "Combined CW Laser and Furnace Annealing . . . " *Appl. Surf. Sci.*, 36 (1989) pp. 597–604.

C. Hayzelden et al., "*In Situ* Transmission Electron Microscopy Studies of Silicide–Mediated Crystallization of Amorphous Silicon" (3 pages).

A.V. Dvurechenskii et al., "Transport Phenomena in Amorphous Silicon Doped by Ion Implantation of 3d Metals", *Akademikian Lavrentev Prospekt* 13, 630090 Novosibirsk 90, USSR, pp. 635–640.

(List continued on next page.)

*Primary Examiner*—Robert Kunemund
*Attorney, Agent, or Firm*—Sixbey, Friedman, Leedom & Ferguson, P.C.; Gerald J. Ferguson, Jr.; Jeffrey L. Costellia

[57] ABSTRACT

Thin-film transistors (TFTs) having characteristics comparable to those of a single-crystal silicon wafer are provided. A buffer film made from silicon oxide is formed on a first amorphous silicon film. A nickel acetate solution containing a metal element such as nickel for promoting crystallization of silicon is applied to the first amorphous silicon film. The laminate is heat-treated to form a nickel silicide layer. The nickel silicide layer is then patterned. A second amorphous silicon film is formed and heat-treated to grow crystals. Thus, monodomain regions which can be regarded as single crystals are formed. Active layers of TFTs are formed from these monodomain regions.

26 Claims, 8 Drawing Sheets

U.S. PATENT DOCUMENTS

| | | |
|---|---|---|
| 5,580,792 | 12/1996 | Zhang et al. . |
| 5,585,291 | 12/1996 | Ohtani et al. . |
| 5,589,694 | 12/1996 | Takayama et al. . |
| 5,595,923 | 1/1997 | Zhang et al. . |
| 5,595,944 | 1/1997 | Zhang et al. . |
| 5,604,360 | 2/1997 | Zhang et al. . |
| 5,605,846 | 2/1997 | Ohtani et al. . |
| 5,606,179 | 2/1997 | Yamazaki et al. . |
| 5,608,232 | 3/1997 | Yamazaki et al. . |
| 5,612,250 | 3/1997 | Ohtani et al. . |
| 5,614,426 | 3/1997 | Funada et al. . |
| 5,614,733 | 3/1997 | Zhang et al. . |
| 5,616,506 | 4/1997 | Takemura . |
| 5,620,910 | 4/1997 | Teramoto . |
| 5,621,224 | 4/1997 | Yamazaki et al. . |
| 5,624,851 | 4/1997 | Takayama et al. . |
| 5,637,515 | 6/1997 | Takemura . |
| 5,639,698 | 6/1997 | Yamazaki et al. ............... 437/228 |
| 5,643,826 | 7/1997 | Ohtani et al. . |
| 5,646,424 | 7/1997 | Zhang et al. . |
| 5,654,203 | 8/1997 | Ohtani et al. . |
| 5,656,825 | 8/1997 | Kusumoto et al. . |
| 5,663,077 | 9/1997 | Adachi et al. . |
| 5,677,549 | 10/1997 | Takayama et al. . |
| 5,696,386 | 12/1997 | Yamazaki . |
| 5,696,388 | 12/1997 | Funada et al. . |
| 5,700,333 | 12/1997 | Yamazaki et al. . |
| 5,705,829 | 1/1998 | Miyanaga et al. . |
| 5,712,191 | 1/1998 | Nakajima et al. . |

OTHER PUBLICATIONS

T. Hempel et al., "Needle–Like Crystallization of Ni Doped Amorphous Silicon Thin Films", *Solid State Communications,* vol. 85, No. 11, pp. 921–924, 1993.

R. Kakkad et al., "Crystallized Si films by low–temperature rapid thermal annealing of amorphous silicon," *J.Appl. Phys.,* 65(5), Mar. 1, 1989, pp. 2069–2072.

G. Liu et al., "Polycrystalline silicon thin film transistors on Corning 7059 glass substrates using short time, low–temperature processing," *Appl. Phys. Lett.* 62(20), May 17, 1993, pp. 2554–2556.

G. Liu et al., "Selective area crystallization of amorphous silicon films by low–temperature rapid thermal annealing," *Appl. Phys. Lett.* 55(7), Aug. 14, 1989, pp. 660–662.

R. Kakkad et al., "Low Temperature Selective Crystallization of Amorphous Silicon," *Journal of Non–Crystalline Solids,* 115, 1989, pp. 66–68.

Partial English Translation of Japanese Patent No. 2–222546 to Mogami.

Impurity Ions & Laser Light

Impurity Ions & Laser Light

FIG.6C
Impurity Ions & Laser

METHOD OF FABRICATING SEMICONDUCTOR DEVICE

BACKGROUND OF THE INVENTION

1. Field of the Invention

The present invention relates to a method of fabricating a semiconductor device using a crystalline thin-film semiconductor and, more particularly, to a method of fabricating thin-film transistors (TFTs).

2. Description of the Related Art

In recent years, transistors (known as TFTs) using a thin-film semiconductor formed on a substrate made of glass or quartz have attracted attention. In particular, a thin-film semiconductor having a thickness of hundreds of thousands of angstroms is formed on the surface of the substrate of glass or quartz. Transistors (gate-insulated field-effect transistors) are formed, using this thin-film semiconductor.

It is known that these thin-film transistors can be applied to active matrix liquid crystal displays. In such an active matrix liquid crystal display, hundreds of thousands of pixels or more pixels are arranged in rows and columns. TFTs are arranged as switching devices for these pixels, respectively, to provide a high-speed display with high information content.

Of these TFTs used in such active matrix liquid crystal displays, TFTs using amorphous thin silicon films have been put into practical use. However, these TFTs using amorphous thin silicon films have the problem that their characteristics are poor. For example, where an active matrix liquid crystal display having higher display performance should be constructed, the characteristics of the TFTs using amorphous thin silicon films are not satisfactory.

Furthermore, an integrated liquid crystal display system has been proposed. In this system, the peripheral driver circuit is made up of TFTs similarly to switching devices for pixels. All of these TFTs are packed on a single substrate. Unfortunately, TFTs using amorphous thin silicon films cannot construct the peripheral driver circuit because of their low operating speed. Especially, with TFTs using amorphous thin silicon films, it is difficult to fabricate a practical P-channel type. That is, the characteristics are so poor that any practical device cannot be obtained. Hence, there is the fundamental problem that CMOS circuits cannot be built.

In addition, a technique for forming an integrated circuit for processing or storing image data or the like integrally with a pixel region and a peripheral driver circuit on the same substrate has been proposed. However, with TFTs using amorphous thin silicon films, an integrated circuit capable of processing image data cannot be constructed because of their poor characteristics.

A further technique for fabricating a higher-performance TFT from a crystalline silicon film is known. The characteristics of this higher-performance TFT is much better than those of a TFT using an amorphous thin silicon film. In this known technique, after formation of the amorphous silicon film, a heat treatment or laser irradiation is performed to change the amorphous silicon film into a crystalline silicon film. This crystalline silicon film obtained by crystallizing the amorphous silicon film generally has a polycrystalline or crystallitic structure.

Where a TFT is fabricated, using a crystalline silicon film, characteristics much better than those obtained when an amorphous silicon film is used can be obtained. The mobility of a TFT is one index used to evaluate its characteristics. An N-channel TFT using an amorphous silicon film has a mobility of 1 to 2 $cm^2/Vs$ or less. An N-channel TFT using a crystalline silicon film has a mobility of more than about 100 $cm^2/Vs$. A P-channel TFT using a crystalline silicon film has a mobility of more than about 50 $cm^2/Vs$.

However, a crystalline silicon film obtained by crystallizing an amorphous silicon film has a polycrystalline structure and many problems due to crystal grain boundaries exist. For example, some carriers move through the grain boundaries. This severely limits the withstand voltage of the TFT. Furthermore, when it is operated at a high speed, a variation or deterioration in characteristics tends to occur. Additionally, carriers moving through grain boundaries increase the OFF current, or leakage current.

Where one attempts to construct an integrated active matrix liquid crystal display having a higher device density, it is desired to form a peripheral circuit on one glass substrate, along with a pixel region. In this case, in order to drive hundreds of thousands of pixel transistors arranged in rows and columns, TFTs arranged in the peripheral circuit are required to handle large currents.

In order to obtain TFTs capable of treating large currents, it is necessary to adopt a structure having an increased channel width. However, if the channel width of TFTs using a crystalline silicon film is increased, the resulting withstand voltage makes it impossible to use the TFTs in practice. Furthermore, the threshold value varies so greatly that the TFTs cannot be put into practical use.

When one tries to construct an integrated circuit for processing image data from TFTs using crystalline silicon films, it has been impossible to obtain practical integrated circuit (capable of replacing the prior art IC) because of variations in threshold value and by aging effects.

SUMMARY OF THE INVENTION

It is an object of the present invention to provide a thin-film transistor (TFT) which is not affected by crystal grain boundaries.

It is another object of the invention to provide a TFT which withstands high voltages and is capable of handling large currents.

It is a further object of the invention to provide a TFT having characteristics which neither deteriorate nor vary.

It is a yet other object of the invention to provide a TFT having characteristics which are similar to those obtained when a single-crystal semiconductor is used.

The foregoing problems are solved by first through third embodiments of method of fabricating a semiconductor device in accordance with the present invention. This method comprises the steps of: forming a first amorphous silicon film on a substrate having an insulating surface; maintaining a metal element for promoting crystallization of silicon in contact with said first amorphous silicon film; heat-treating said first amorphous silicon film to crystallize it; patterning the crystallized silicon film to form a layer which will become nuclei during crystal growth; forming a second amorphous silicon film so as to cover said layer becoming the nuclei; growing crystals from said layer becoming the nuclei to form a substantially grain boundary-free region in said second amorphous silicon film; and forming an active layer, using said substantially grain boundary-free region in which said crystals have been grown.

In this method, the substrate having the insulating surface can be a glass substrate, a quartz substrate, a glass substrate on which an insulating film is formed, a quartz substrate on which an insulating film is formed, a semiconductor substrate on which an insulating film is formed, and a conductive substrate on which an insulating film is formed.

Figure 1A:
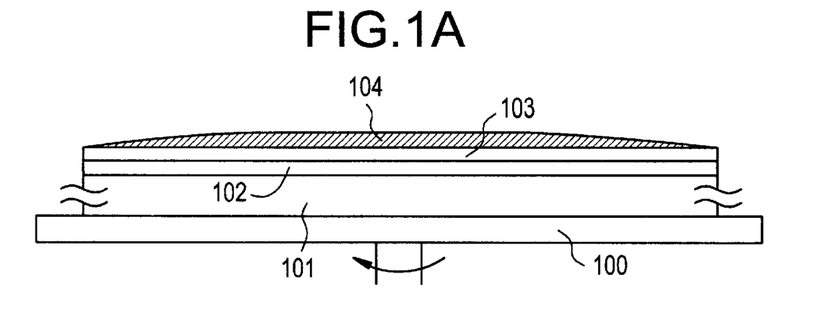
FIGS. 1(A)–1(F) are cross-sectional views of a thin silicon semiconductor film having monodomain regions of Example 1 of the invention, illustrating the process sequence for fabricating the film.
Figure 1B:
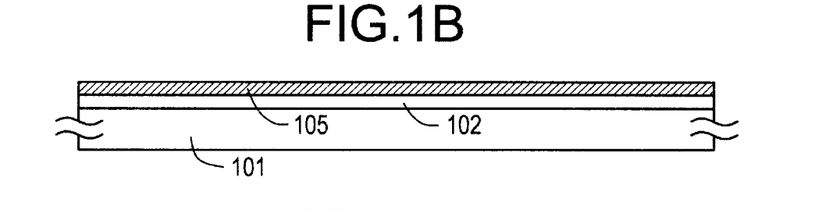

One specific example of the aforementioned step of "maintaining a metal element for promoting crystallization of silicon in contact with said first amorphous silicon film" can be the step illustrated in FIG. 1(A), where an insulating film 102 consisting of silicon oxide is formed on a glass substrate 101. An amorphous silicon film 103 is formed on the insulating film 102. A nickel acetate solution 104 containing nickel which is a metal element for promoting crystallization of silicon is applied to the surface of the amorphous silicon film 103.

FIG. 1(A) illustrates the example in which nickel that is a metal element for promoting crystallization of silicon is maintained in contact with the surface of the amorphous silicon film by the use of a solution. Alternatively, a layer of nickel or a layer containing nickel may be formed on the surface of the amorphous silicon film by sputtering, CVD, or evaporation.

Figure 1C:
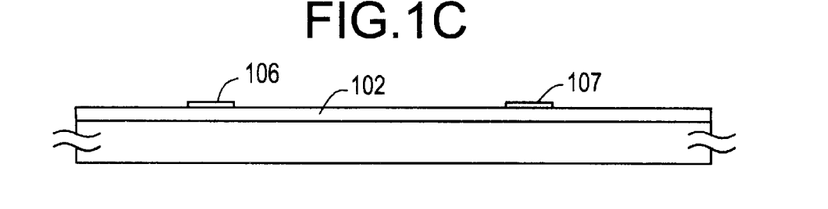

One example of the aforementioned step of "patterning the crystallized silicon film to form a layer which will become nuclei during crystal growth" is the step illustrated in FIG. 1(C).

Figure 1D:
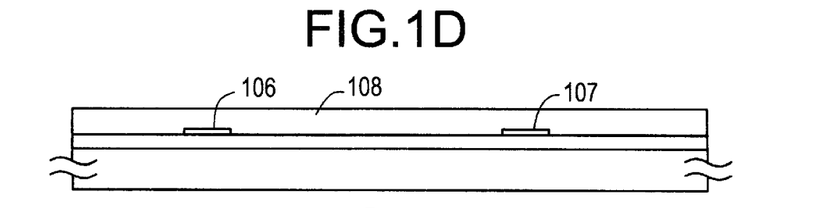

One example of the aforementioned step of "forming a second amorphous silicon film so as to cover said layer becoming the nuclei" can be the step illustrated in FIG. 1(D).

Figure 1E:
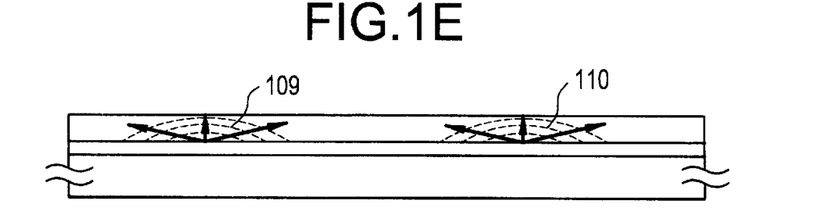
Figure 1F:
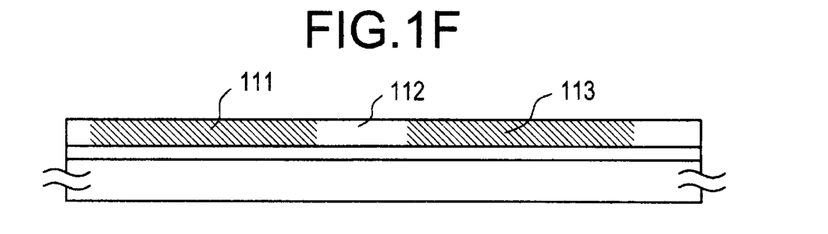

One example of the aforementioned step of "growing crystals from said layer becoming the nuclei to form a substantially grain boundary-free region in said second amorphous silicon film" can be the step illustrated in FIGS. 1(E) and 1(F).

The foregoing problems are solved by fourth through seventh embodiments of method of fabricating a semiconductor device in accordance with the present invention. This method comprises the steps of: forming a layer consisting of or containing a metal element for promoting crystallization of silicon on an insulating surface; patterning said layer containing said metal element; forming an amorphous silicon film so as to cover said patterned layer; growing crystals in said amorphous silicon film, using said patterned layers as nuclei, to form a substantially grain boundary-free region; and forming an active layer, using said substantially grain boundary-free region in which said crystals have been grown.

In this method, the insulating surface can be a surface of a glass substrate, a surface of a quartz substrate, a surface of other ceramic substrate, a surface of an insulating film formed on any of these substrates, a surface of a semiconductor substrate on which an insulating film is formed, and a surface of a conductive substrate on which an insulating film is formed.

Furthermore, the above-described insulating surface can be a surface of a three-dimensional integrated circuit having at least one interlayer film.

Figure 7A:
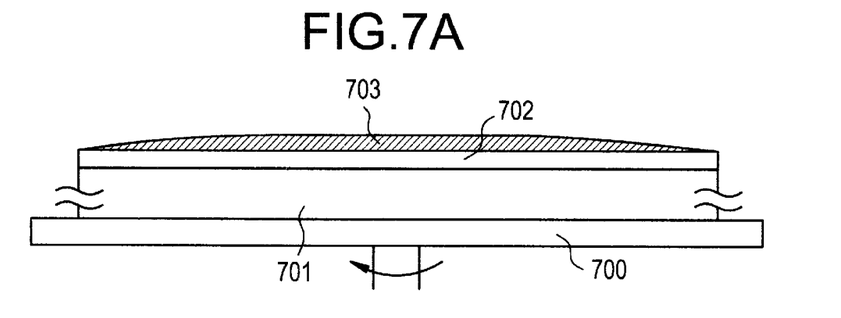
FIGS. 7(A)–7(F) are cross-sectional views of a thin silicon semiconductor film having monodomain regions of Example 7 of the invention, illustrating the process sequence for fabricating the film.
Figure 7B:
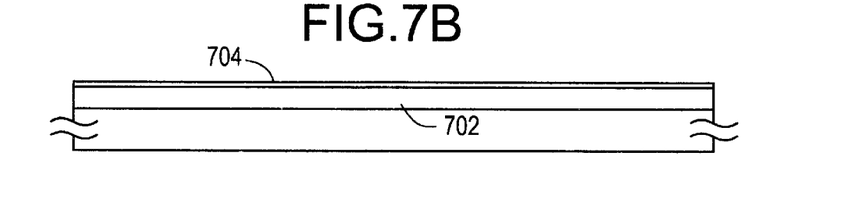

One example of the aforementioned step of "forming a layer consisting of or containing a metal element for promoting crystallization of silicon on an insulating surface" can be the step illustrated in FIG. 7(B), where the laminate is baked after a solution 703 containing a metal element for promoting crystallization of silicon is applied by spin coating at the step of FIG. 7(A). In this way, a layer 704 containing nickel is formed. This layer containing this metal element may also be formed by sputtering, CVD, or evaporation.

Figure 7C:
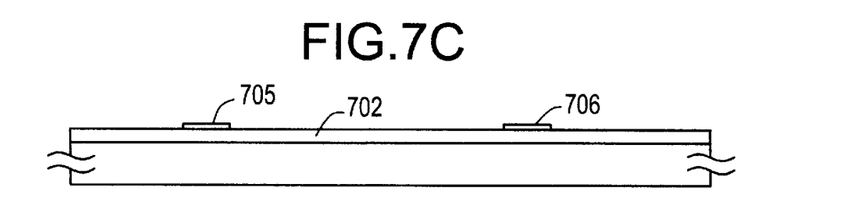

The layer consisting of or containing the metal element is patterned to create nuclei from which crystals will be grown during later crystallization of the amorphous silicon film. This example is illustrated in FIG. 7(C), where the layer 704 containing nickel is patterned to form regions 705 and 706 which will nucleate during a crystal growth step conducted later.

Figure 7D:
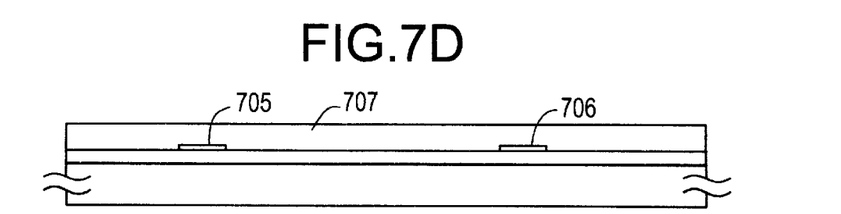

One example of the aforementioned step of "forming an amorphous silicon film so as to cover said patterned layer" can be the step illustrated in FIG. 7(D), where an amorphous silicon film 707 is formed so as to cover the patterned regions 705 and 706 containing nickel. The method of forming the amorphous silicon film 707 can be plasma-assisted CVD or LPCVD.

Figure 7E:
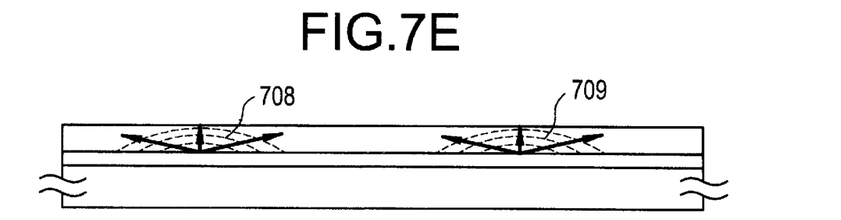

One example of the aforementioned step of "growing crystals in said amorphous silicon film, using said patterned layers as nuclei, to form a substantially grain boundary-free region" can be the step illustrated in FIG. 7(E), where a heating temperature of 450–600° C. is used together with laser irradiation. As a result, crystals are grown as indicated by 708 and 709 in the amorphous silicon film formed so as to cover the patterned regions 705 and 706 containing nickel.

In every embodiment of the invention, the metal element for crystallizing silicon is one or more elements selected from the group consisting of Fe, Co, Ni, Ru, Rh, Pd, Os, Ir, Pt, Cu, and Au.

The substantially grain boundary-free region in which the crystals have been grown can be referred to as a monodomain region. It is important that this monodomain region contain one or more elements which are metal elements for promoting crystallization of silicon, selected from the group consisting of Fe, Co, Ni, Ru, Rh, Pd, Os, Ir, Pt, Cu, and Au, and contained at a concentration of $1\times10^{14}$ to $1\times10^{19}$ atoms $cm^{-3}$.

During this crystal growth, it is important that the laminate be heated at a temperature of 450 to 600° C. Preferably, this heating temperature is made as high as possible. Where a glass substrate is employed, it is necessary that the heating temperature be set below 600° C. because of the maximum processing temperature of the glass substrate. Where the heating temperature is lower than 450° C., it cannot be expected that monodomain regions are effectively formed.

Monodomain regions have none of point defects and two-dimensional defects which become grain boundaries but have point defects to be neutralized. Therefore, the monodomain regions contain 0.001 to 5 atomic % hydrogen or halogen hydrogen for neutralizing the point defects. Also, these monodomain regions contain a metal element for promoting crystallization of silicon at a concentration of $1\times10^{14}$ to $1\times10^{19}$ atoms $cm^{-3}$. This concentration is defined as a minimum value based on data obtained by secondary ion mass spectrometry (SIMS).

At present, it is difficult to measure metal element concentrations lower than $1\times10^{16}$ atoms $cm^{-3}$ by SIMS. However, it is possible to estimate the metal element concentration from the concentration of the metal element contained in the solution used when the metal element is introduced. That is, the concentration not measured by SIMS can be estimated from the relation between the concentration of the metal element in the solution and the concentration of the metal element remaining in the final silicon film, the latter concentration being measured by SIMS.

After a series of manufacturing steps is completed, if the concentration of the metal element in the monodomain region or in a region becoming the monodomain region is in excess of $1\times10^{19}$ atoms $cm^{-3}$, then the semiconductor characteristics of the obtained domain region are impaired.

As a result of this crystal growth, a monodomain region substantially free from crystal grain boundaries can be formed. This monodomain region is equivalent to a single crystal in electrical properties. The monodomain region uses a starting film consisting of a thin-film semiconductor formed by sputtering or CVD, unlike well-known single-crystal silicon wafers. More specifically, the monodomain region has no grain boundaries (such as line defects or two-dimensional defects) but has point defects to be neutralized. For this neutralization, the monodomain region contains 0.001 to 5 atomic % hydrogen or halogen hydrogen.

The active layer of a thin-film semiconductor device is formed, using this monodomain region. As a result, TFTs and even thin-film integrated circuits having characteristics comparable to those of semiconductor devices heretofore fabricated, using single-crystal silicon wafers, can be obtained. For example, TFTs much superior in electrical performance to conventional TFTs fabricated, using crystalline silicon film such as polycrystals or crystallites, can be derived by forming active layers 306 and 307 of TFTs through the use of monodomain regions 303 and 305 shown in FIG. 2(A).

It is not necessary that every active layer be a monodomain region. For example, in the case of a TFT, if only the channel formation region is made from a monodomain region, then advantages can be had.

When a solid-phase epitaxy process is carried out, using a metal element for promoting crystallization, two major methods are available to introduce the metal element.

One of these two methods is to form an extremely thin film of a metal element by sputtering, electron-beam evaporation, or other "physical formation" method on the surface of an amorphous silicon film or on the surface of a buffer layer lying on the amorphous silicon film. In these methods, the film of the metal element is formed in contact with the amorphous silicon film. As a result, the metal element is introduced into the amorphous silicon film.

This method has the problem that it is difficult to accurately control the concentration of the metal element introduced in the film. Also, where the film thickness is set to a quite small value such as less than tens of angstroms to control the amount of the introduced element, it is difficult to form a complete film. In this case, the metal element film is formed like islands on the desired surface. That is, a discontinuous layer is formed. This problem can be solved by making use of molecular beam epitaxy (MsE) or other method. However, the present situation is that the problem is solved only within a limited area.

Where a crystallizing step is performed after such a discontinuous layer is formed, each island region of the discontinuous layer becomes a crystal nucleus, thus promoting crystallization.

Careful observation of this silicon film which has been crystallized as described above has revealed that a very large amount of an amorphous component is left. This can be confirmed by optical microscopy, electron microscopy, or Raman spectroscopy. Also, it has been confirmed that the metal component is partially clustered. It is considered that the metal component in the form of crystal nuclei is left in the regions of the nuclei as it is, thus forming the clustering.

The regions in which the metal component is partially clustered act as electron-hole recombination centers in the crystallized semiconductor region. These recombination centers severely deteriorate the characteristics, e.g., the leakage current from the TFT is increased.

The other method is to use a solution containing a metal element for promoting crystallization of silicon. In this method, the metal element is contained in a solution. This solution is applied either to the surface of an amorphous silicon film or to the surface of a buffer film overlying the amorphous silicon film by spin coating or other method.

The solution can take the form of some kinds, depending on the used metal element. Typically, metal compounds assuming the form of solutions can be used. Examples of the metal compounds which can be utilized for this method using a solution are given below.

(1) Where Ni is used as a metal element

As a nickel compound, at least one selected from the group consisting of nickel bromide, nickel acetate, nickel oxalate, nickel carbonate, nickel chloride, nickel iodide, nickel nitrate, nickel sulfate, nickel formate, nickel oxide, nickel hydroxide, nickel acetylacetonate, 4-cyclohexy 1 nickel butyrate, and 2-ethyl hexanoic nickel can be used.

As a nonpolar solvent containing Ni, at least one nonpolar solvent selected from the group consisting of benzene, toluene-xylene, carbon tetrachloride, chloroform, ether, trichloro-ethylene, and Freon can be used.

(2) Where Fe (iron) is used as a metal element

As a ferric or ferrous material, one selected from the group consisting of ferrous bromide ($FeBr_26H_2O$), ferric bromide ($FeBr_36H_2O$), ferric acetate ($Fe(C_2H_3O_2)_3xH_2O$), ferric chloride ($FeCl_24H_2O$), ferric chloride ($FeCl_36H_2O$), ferric fluoride ($FeF_33H_2O$), ferric nitrate ($Fe(NO_3)_39H_2O$), ferrous phosphate ($Fe_3(PO_4)_28H_2O$), and ferric phosphate ($FePO_42H_2O$) can be used.

(3) Where Co (cobalt) is used as a metal element

As a cobalt compound, one selected from the group consisting of cobalt bromide ($CoBr6H_2O$), cobalt acetate ($Co(C_2H_3O_2)_24H_2O$), cobalt chloride ($COCl_26H_2O$), cobalt fluoride ($CoF_2xH_2O$), and cobalt nitrate ($Co(No_3)_26H_2O$) can be used.

(4) Where Ru (ruthenium) is used as a metal element

As a compound of ruthenium, a material known as a ruthenium salt such as ruthenium chloride ($RuCl_3H_2O$) can be used.

(5) Where Rh (rhodium) is used as a metal element

As a compound of rhodium, a material known as a rhodium salt such as rhodium chloride ($RhCl_33H_2O$) can be used.

(6) Where Pd (palladium) is used as a metal element

As a compound of palladium, a material known as a palladium salt such as palladium chloride ($PdCl_22H_2O$) can be used.

(7) Where Os (osmium) is used as a metal element

As a compound of osmium, a material known as an osmic or osmious material such as osmium chloride ($OsCl_3$) can be used.

(8) Where Ir (iridium) is used as a metal element

As a compound of iridium, a material known as an iridium salt such as iridium trichloride ($IrCl_33H_2O$) or iridium tetrachloride ($IrCl_4$) can be used.

(9) Where Pt (platinum) is used as a metal element

As a compound of platinum, a material known as a platinum salt such as platinic chloride ($PtCl_45H_2O$) can be used.

(10) Where Cu (copper) is used as a metal element

As a compound of copper, a material selected from the group consisting of cupric acetate ($Cu(CH_3COO)_2$), cupric chloride ($CuCl_22H_2O$), and cupric nitrate ($Cu(NO_3)_23H_2O$) can be used.

(11) Where gold is used as a metal element

As an auric compound, a material selected from the group consisting of gold trichloride ($AuCl_3 xH_2O$), aurichloride ($AuHCl_4 4H_2O$), and gold sodium tetrachloride ($AuNaCl_4 2H_2O$) can be used.

These can be sufficiently separated into single molecules and dispersed in a solution. If this solution is dripped onto a desired surface to which a metal element is added, the surface is rotated at a speed of 50 to 500 rpm. Under this condition, the surface is spin-coated with the solution. In this way, the solution can be spread over the whole surface.

At this time, if a silicon oxide film having a thickness of 5 to 100 Å is formed on the surface of a silicon semiconductor to enhance the uniformity of the wettability with the desired surface of the silicon semiconductor, then surface tension of the liquid can sufficiently prevent the liquid from being distributed like dots on the desired surface.

If a surface active agent is added to the liquid, a uniformly wetted state can be assumed on a silicon semiconductor having no silicon oxide film thereon. It can be said that this method using a solution forms a film of an organometallic compound containing the metal element on the desired surface.

Individual atoms of the metal element for promoting crystallization of silicon can be diffused into the semiconductor through an oxide film. The diffusion process is performed without intentionally creating crystal nuclei or grains. The whole film can be uniformly crystallized. As a result, clustering of the metal element is prevented. Also, it is unlikely that a large amount of amorphous component is left behind.

Another method can also be utilized. In particular, an organometallic compound is uniformly coated on a desired surface. The formed coating is processed with ozone, i.e., irradiated with ultraviolet radiation within oxygen, to form a metal oxide film. This metal oxide film is used as a starting material for crystallization. In this method, an oxide film of the metal is formed. The crystallization progresses from this metal oxide film. Thus, the organic material is oxidized and can be driven off as carbon dioxide gas. Hence, more uniform solid-phase epitaxial growth can be achieved.

If the spin coating of the solution is effected only at a low speed, the metal component in the solution which exists on the surface is supplied onto the semiconductor film. The amount of the supplied component often exceeds the amount which is necessary for solid-phase epitaxial growth. Therefore, after the low-speed rotation, the laminate is rotated at a speed of 1,000 to 10,000 rpm, typically 2,000 to 5,000 rpm. Thus, the excessive organic metal can be fully swept out the laminate surface. As a result, an appropriate amount of metal component can be supplied.

The amount of the introduced metal component can be controlled by controlling the concentration of the metal element in the solution. This method is quite useful in that the concentration of the metal element introduced in the final silicon film can be precisely controlled.

This method using a solution to introduce the metal element makes it possible to form a uniform and continuous layer on the semiconductor surface without creating islands on the semiconductor surface or on the buffer layer surface out of metal particles used for crystallization.

At a crystallization step making use of heating or laser irradiation, uniform and dense crystals can be grown.

In this example, a solution is used. Similar advantages can be obtained by forming a film of a metal compound, especially a gaseous organometallic compound, on a desired surface by CVD.

It can be said this method using a solution is a chemical method of formation. Also, it can be said that the method of formation utilizing sputtering or the like is a physical method of formation. The physical formation method can be referred to as a nonuniform anisotropic crystal growth method using metal nuclei. On the other hand, the chemical formation method can be referred to as uniform isotropic crystal growth using a uniform metal element.

Other objects and features of the invention will appear in the course of the description thereof, which follows.

DESCRIPTION OF THE PREFERRED EMBODIMENTS

EXAMPLE 1

In the present example, crystal nuclei consisting of a silicon film are selectively formed on a substrate having an insulating substrate. The silicon film has been crystallized by the action of a metal element for promoting growth of silicon crystals. Then, an amorphous silicon film is formed. Subsequently, the amorphous silicon film is irradiated with laser light to induce crystal growth. In this way, monodomain regions are selectively formed.

FIGS. 1(A)–1(F) illustrate the process sequence of the present example. First, a silicon oxide film is formed as a buffer film 102 to a thickness of 3000 Å on a glass substrate 101 by sputtering techniques. This buffer film 102 acts as a barrier layer against alkali ions and impurities diffusing out of the glass substrate 101. The buffer film 102 can be made from any desired material as long as it forms an insulating film and serves as a barrier. For instance, a silicon nitride film can be used.

After forming the buffer film 102, an amorphous silicon film 103 is formed to a thickness of 5 to 500 Å, e.g., 200 Å by plasma-assisted CVD or low-pressure CVD (LPCVD). This amorphous silicon film 103 will be used to form crystal nuclei later.

Then, a solution 104 containing nickel which is a metal element for promoting crystallization of silicon is applied, using a spinner 100. The amount of the nickel element added can be adjusted by controlling the amount of the nickel in the solution 104. In this example, nickel acetate solution is used as the solution 104 containing nickel. In this way, nickel is introduced into the whole surface of the amorphous silicon film 103. In other words, nickel is in contact with the whole surface of the amorphous silicon film 103 (FIG. 1(A)).

In this example, the solution is employed to introduce nickel. Alternatively, a layer consisting of nickel or a layer containing nickel may be formed on the surface of the amorphous silicon film 103 by sputtering, CVD, or evaporation.

Thereafter, the amorphous silicon film 103 is heat-treated at 450–600° C. (in this example, at 550° C.) for 4 hours to crystallize the amorphous silicon film 103, thus obtaining a crystalline silicon film 105. This crystalline silicon film 105 assumes a polycrystalline or crystallitic state (FIG. 1(B)).

Then, the crystalline silicon film 105 is patterned to form layers 106 and 107 which will become crystal nuclei in later steps (FIG. 1(C)).

Subsequently, an amorphous silicon film 108 is formed to a thickness of 500 Å by plasma-assisted CVD or LPCVD. This amorphous silicon film 108 will form the active layer of a semiconductor device such as a TFT (FIG. 1(D)).

Then, the laminate is irradiated with laser light while heating the laminate at 450 to 600° C. The upper limit of the heating temperature is determined by the maximum processing temperature of the substrate. At this manufacturing step, crystals are grown as indicated by 109 and 110 from the portions 106 and 107, respectively, which will act as nuclei during the crystal growth (FIG. 1(E)).

In this way, monodomain regions 111 and 113 which can be regarded as single crystals as shown in FIG. 1(F) are formed. An amorphous region 112 where crystallization of the amorphous silicon film 108 has not progressed exists between the monodomain regions 111 and 113.

EXAMPLE 2

In the present example, a pair of transistors consisting of an N-channel transistor and a P-channel transistor are formed, utilizing the method of forming monodomain regions as described in Example 1. In the present example, a pair of TFTs are formed on a glass substrate. A plurality of TFTs may also be formed by the same method.

First, a silicon oxide film is formed as a buffer film 302 to a thickness of 3000 Å on a glass substrate 301. Monodomain regions 303 and 305 are formed on the buffer layer by the method described in Example 1. An amorphous region 304 where crystallization of the amorphous silicon film 108 has not progressed exists between the monodomain regions 303 and 305 (FIG. 2(A)).

Figure 2A:
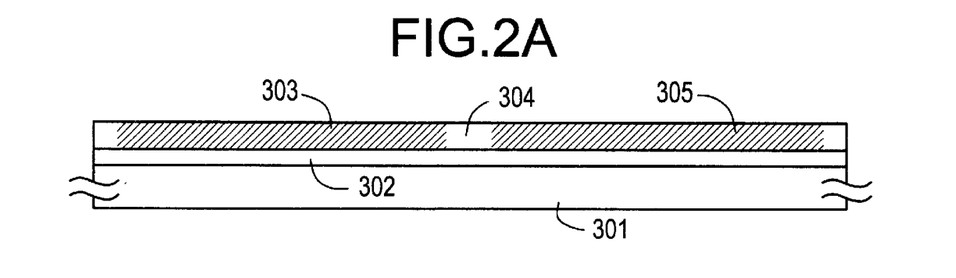
FIGS. 2(A)–2(D) are cross-sectional views of TFTs of Example 2 of the invention, illustrating the process sequence for fabricating the TFTS.

Then, the laminate is patterned so as to remove the amorphous region 304, thus forming active layers 306 and 307 for two TFTs. In FIG. 2(A), the active layer 306 is the active layer of a TFT of the N-channel type, whereas the active layer 307 is the active layer of a TFT of the P-channel type (FIG. 2(B)).

Figure 2B:
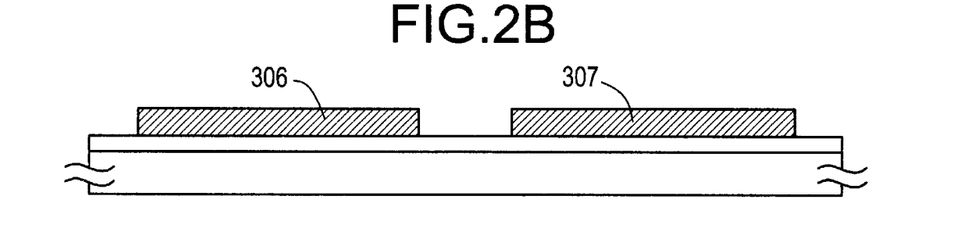

In this example, the whole active layer 306 is located within the monodomain region 303. Similarly, the whole active layer 307 is located within the monodomain region 305. It is necessary that at least channel formation regions be formed inside the monodomain regions 303 and 305, respectively.

Subsequently, a layer consisting mainly of aluminum and containing scandium is formed to a thickness of 6000 Å and patterned to form gate electrodes 309 and 310. In an electrolytic solution, an anodic oxidation process is performed, using the gate electrodes 309 and 310 as anodes. As a result, oxide layers 311 and 312 are formed to a thickness of about 2000 Å. The oxide layers 311 and 312 will act as masks in an ion implantation step conducted later. Offset regions can be formed with a desired length by controlling the thickness of the oxide layers 311 and 312.

Impurity ions are implanted into the active layers 306 and 307. At this manufacturing step, the right TFT region is first masked with a resist, and phosphorus ions are lodged into the left TFT region. In this way, an N-channel source region 313, a channel formation region 315, and a drain region 316 are formed in the active layer 306 of the left TFT by self-aligned techniques. At the same time, an offset region 314 is formed by self-aligned techniques. Then, boron ions are implanted into the right TFT region while masking the left TFT. In this manner, a P-channel source region 317, a channel formation region 319, and a drain region 319 are formed in the active layer 307 of the left TFT by self-aligned techniques. At the same time, an offset region 318 is formed by self-aligned techniques (FIG. 2(C)).

Figure 2C:
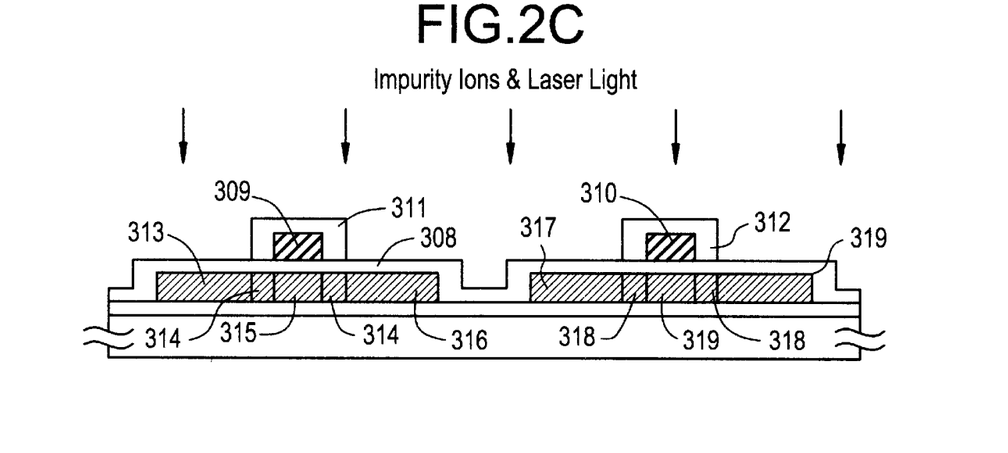

The laminate is irradiated with laser light or other intense light to anneal out the damage to the active layers caused during the ion implantation step. At the same time, the implanted impurity ions are activated. If this step is carried out while heating the laminate at 450 to 600° C., then desirable results arise.

Figure 2D:
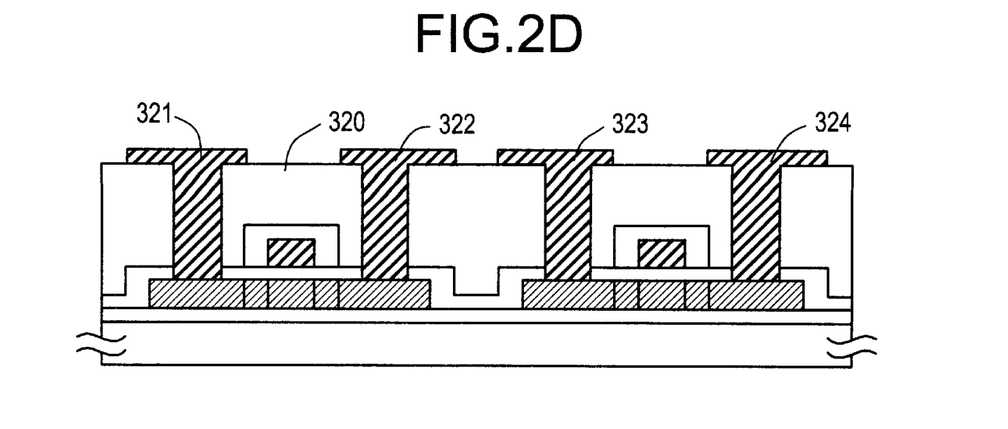

Then, a silicon oxide film 320 is formed as an interlayer insulating film to a thickness of 6000 Å by plasma-assisted CVD. Contact holes are formed in the silicon oxide film 320. Thereafter, a source electrode 321 and a drain electrode 322 are formed for an N-channel TFT out of aluminum. A source electrode 323 and a drain electrode 324 are formed for a P-channel TFT out of aluminum. The laminate is heat-treated at 350° C. in a hydrogen ambient, thus completing the N-channel TFT and the P-channel TFT (FIG. 2(D)).

The TFTs described in the present example are constructed, using the active layers of the TFTs which can be regarded as single crystals, i.e., using monodomain regions. Consequently, their threshold values are not varied. Also, it is unlikely that their characteristics are changed by aging effects. Furthermore, the TFTs described in the present example are capable of high-speed operation and so various thin-film integrated circuits can be fabricated.

EXAMPLE 3

The present invention relates to the construction of TFTs arranged at pixels of an active matrix liquid crystal display. FIGS. 3(A)–3(D) illustrate the process sequence for fabricating the TFTs described in the present example. First, a silicon film having a monodomain region 303 is formed on a buffer film 302 by the method described in Example 1, the buffer film 302 being formed on a glass substrate 301 (FIG. 3(A)).

Figure 3A:
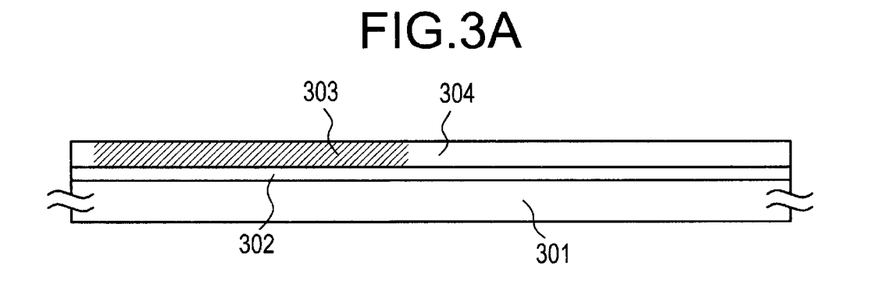
FIGS. 3(A)–3(D) are cross-sectional views of TFTs of Example 3 of the invention, illustrating the process sequence for fabricating the TFTs.
Figure 3B:
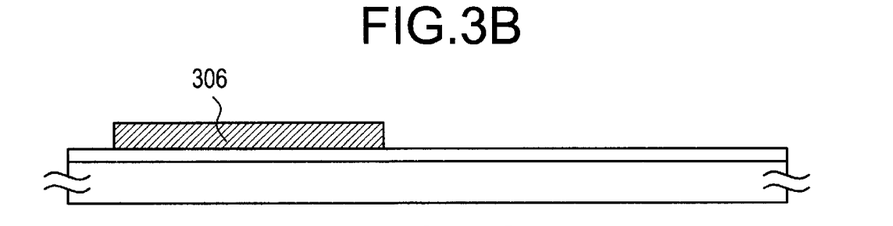
Figure 3C:
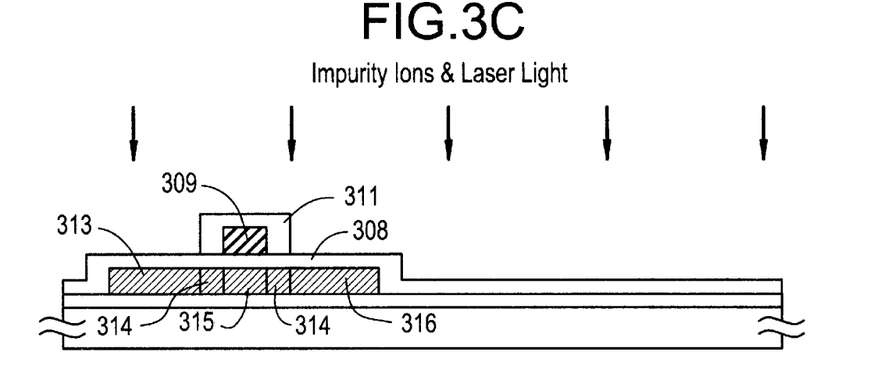
Figure 3D:
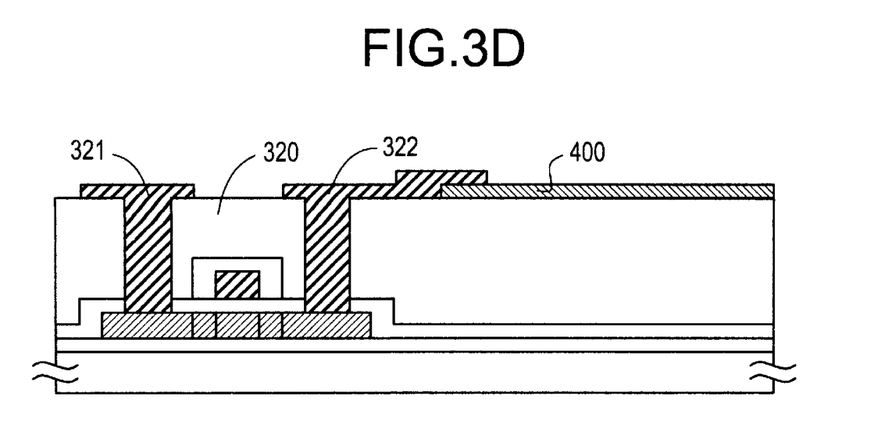

The monodomain region 303 is patterned to form an active layer 306 for N-channel TFTs (FIG. 3(B)).

Then, a silicon oxide film 308 which will become a gate-insulating film is formed to a thickness of 1000 Å by plasma-assisted CVD. A film consisting principally of aluminum and containing scandium is formed to a thickness of 6000 Å by electron-beam evaporation. This film is patterned to form gate electrodes 309. In an electrolytic solution, an anodic oxidation process is performed, using the gate electrodes 309 as anodes. In this way, an oxide layer 311 is formed around each gate electrode 309. This oxide layer 311 will act as a mask in an ion implantation step conducted later, and is used to form offset regions. The thickness of the oxide layer 311 is on the order of 2000 Å.

Thereafter, impurity ions are implanted. In this example, phosphorus ions are implanted by ion doping techniques to introduce phosphorus ions in the regions 313 and 316. At this step, the source region 313 and the drain region 316 are formed by self-aligned techniques. At the same time, a channel formation region 315 and an offset region 314 are formed by self-aligned techniques (FIG. 3(C)).

The laminate is annealed by irradiation of laser light or other intense light. The silicon oxide film 320 is formed as an interlayer insulating film to a thickness of 6000 Å. Then, ITO electrodes 400 becoming pixel electrodes are formed. Contact holes are formed in the silicon oxide film 320. The source electrodes 321 and drain electrode 322 are formed from aluminum. The drain electrode 322 is connected with the ITO electrodes 400 which are the pixel electrodes (FIG. 3(D)).

The active layers of the TFTs described in the present example are constructed, using a monodomain region substantially free from crystal grain boundaries. Hence, the OFF current which would normally be induced by the presence of grain boundaries can be reduced greatly. Therefore, these TFTs can be optimally used as the pixel electrodes of an active matrix liquid crystal display.

EXAMPLE 4

Figure 4:
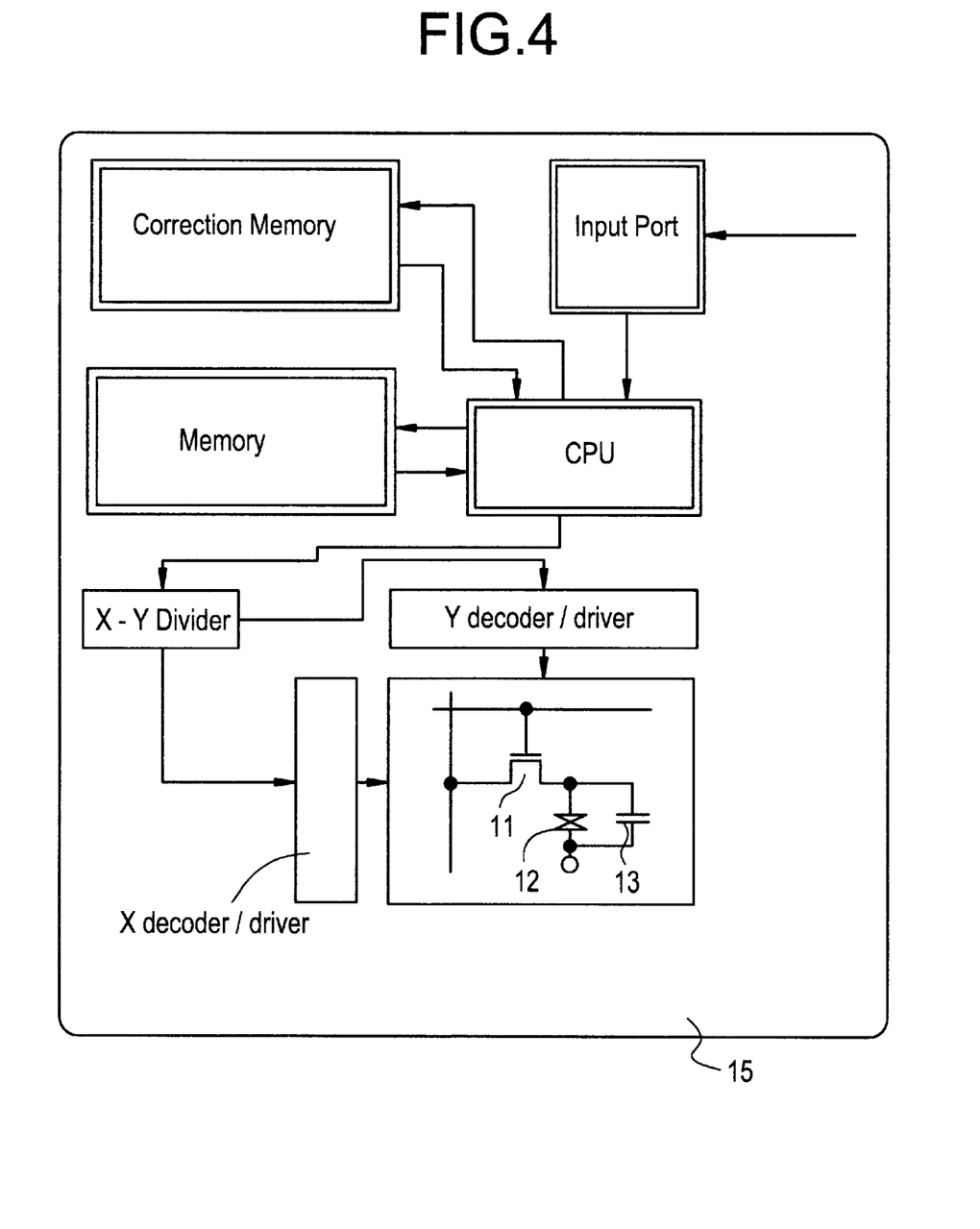
FIG. 4 is a schematic block diagram of a liquid crystal display of Example 4 of the invention.

An example in which a more sophisticated active matrix liquid crystal display is constructed, using the present invention, is shown in FIG. 4. At present, miniaturization, lighter weight, and reduced thickness are achieved by mounting a semiconductor chip (IC) on at least one of two plates of a liquid crystal display, for the reason described below. A liquid crystal material is sandwiched between the two plates. The semiconductor chip is usually mounted on the main board of a computer. It is impossible to construct an integrated circuit having characteristics comparable to those of a well-known IC chip from TFTs formed on a glass plate having an insulating surface.

However, where TFTs using a monodomain region which is substantially free from the effects of crystal grain boundaries are employed, an integrated circuit comparable to the prior art IC chip can be built, because of their good characteristics and high stability.

Referring to FIG. 4, a plate 15 is one of two plates of a liquid crystal display. An active matrix circuit, an X decoder/driver and a Y decoder/driver for driving the active matrix circuit, and an XY branching circuit are formed from TFTs on the plate 15. A multiplicity of pixels are formed in the active matrix circuit. Each pixel comprises a TFT (thin-film transistor) 11, a pixel electrode 12, and an auxiliary capacitor 13.

In order to drive the active matrix circuit, it is necessary that a buffer circuit having a low output impedance be disposed in a peripheral circuit. In the configuration of FIG. 4, this buffer circuit is constructed from TFTs having active layers formed from the monodomain region which is created in accordance with the present invention. In this way, large currents can be passed through the buffer circuit. Also, the buffer circuit can withstand high voltages.

A thin-film integrated circuit utilizing TFTs formed according to the present invention is formed on the plate 15. In a portion which cannot be constructed from the thin-film integrated circuit, a well-known IC chip is mounted. Of course, every integrated circuit can consist of the thin-film integrated circuit fabricated, using the thin-film semiconductor formed on the surface of the plate 15. Various IC chips and semiconductor chips can be connected into the circuitry on the plate 15 by conductor patterns, wire bonding, COG (chip on glass), or other means.

Referring also to FIG. 4, there are further provided an input port, a CPU, a correcting memory, and a main memory. The input port is a circuit which reads a signal applied from the outside and converts the signal into a signal adapted for an image. The correcting memory is a memory intrinsic in the active matrix panel and acts to correct the input signal according to the characteristics of the active matrix panel or plate. This correcting memory is a nonvolatile memory for holding each different piece of information about each different pixel and for correcting each different piece of information. More specifically, if any one of the pixels of the electrooptical device has a point defect, the correcting memory delivers a signal to the CPU, the signal being corrected according to pixels located around the defect. The CPU controls the XY branching circuit according to the corrected signal so that the defect in the pixel becomes less conspicuous. If the defective pixel is darker than the surrounding pixels, a larger signal is applied to the defective pixel in response to the corrected signal from the correcting memory. As a result, the defective pixel is made equal in brightness to the surrounding pixels. Information about pixel defects is different from panel to panel and, therefore, information stored in the correcting memory differs among individual panels.

The CPU and the main memory are similar in function to those of an ordinary computer. The main memory includes a RAM acting as an image memory in which information about each pixel is stored. These CPU and main memory are CMOS chips.

In this way, the CPU and the main memory are formed on the liquid crystal display plate. Hence, this single plate forms an electronic instrument similar to a simple personal computer. This is quite useful in miniaturizing the liquid crystal display and extending its application. If the integrated circuit consists entirely or partially of a thin-film integrated circuit which is formed on a plate, using a thin-film semiconductor, then the liquid crystal display is more effectively reduced in size. This is also effective in extending the application.

TFTs constructed, using monodomain regions, can form an integrated circuit comparable to an integrated circuit formed on a single-crystal silicon wafer. Consequently, the novel TFTs can be used in the required circuits of the liquid crystal display systematized as described in the present example. Especially, if TFTs fabricated, using monodomain regions capable of being regarded as single crystals, are exploited in the analog buffer circuit and other required circuits, then great advantages can be obtained.

EXAMPLE 5

In the present example, when monodomain regions are formed, active layers of TFTs are formed so as to avoid nickel silicide regions which will become crystal nuclei. Thus, TFTs which are less affected by nickel element are provided.

FIGS. 5(A)–5(F) and 6(A)–6(D) illustrate the process sequence for fabricating TFTs of the present example. First, a buffer film 102 is formed on a glass substrate 101. An amorphous silicon film is formed on the buffer film 102 to a thickness of 200 Å by plasma-assisted CVD or LPCVD. A nickel acetate solution 104 is applied to the amorphous film by the method described in Example 1 (FIG. 5(A)).

Figure 5A:
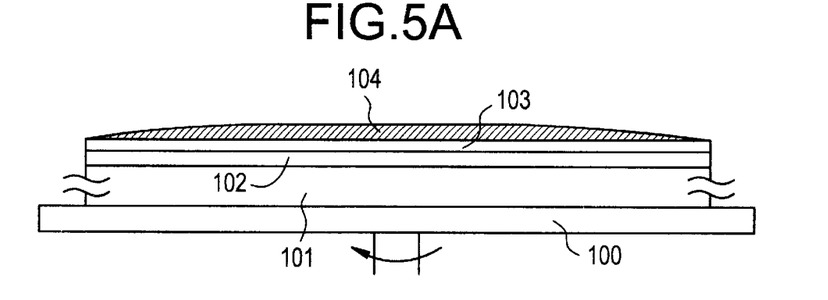
FIGS. 5(A)–5(F) are cross-sectional views of TFTs of Example 5 of the invention, illustrating the process sequence for fabricating the TFTs.
Figure 5B:
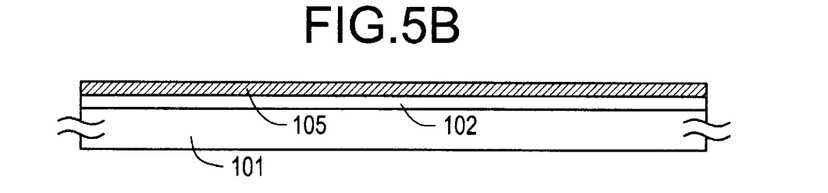

Then, the laminate is heat-treated at 400° C. for 1 hour, thus forming a nickel silicide layer 105 (FIG. 5(B)).

Figure 5C:
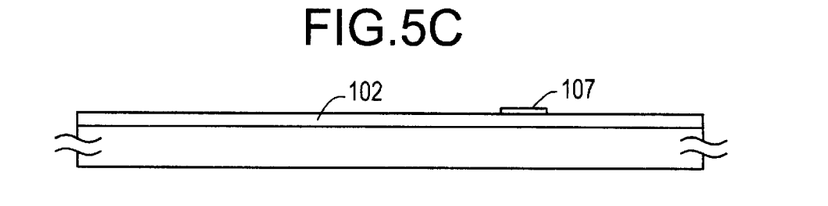

The nickel silicide layer 105 is patterned so that a nickel silicide layer 107 which will become crystal nuclei is selectively left behind (FIG. 5(C)).

Figure 5D:
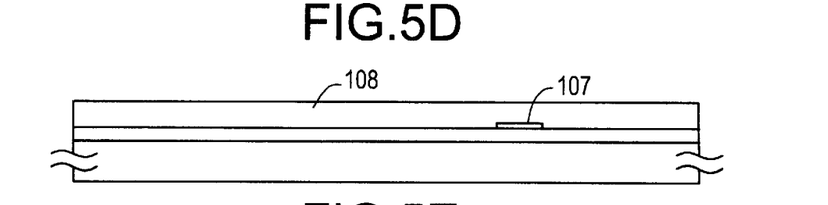

Then, an amorphous silicon film 108 is formed to a thickness of 500 Å by plasma-assisted CVD or LPCVD (FIG. 5(D)).

Figure 5E:
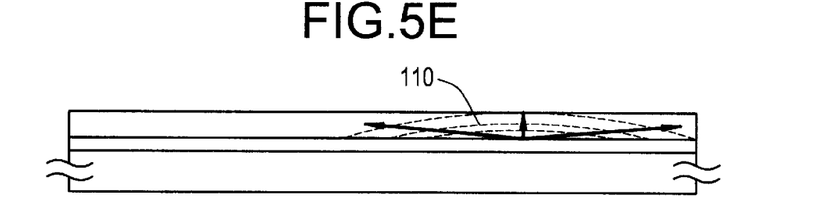
Figure 5F:
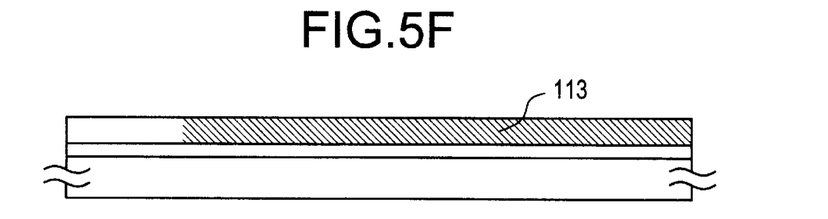

Thereafter, the laminate is irradiated with laser light while heated at a temperature of 550° C. to induce crystal growth as indicated by 110 (FIG. 5(E)). In this way, a monodomain region 113 is formed (FIG. 5(F)). This region is patterned so that an active layer 601 is formed, avoiding the region in which the nickel silicide layer 107 is formed (FIG. 6(A)).

Figure 6A:
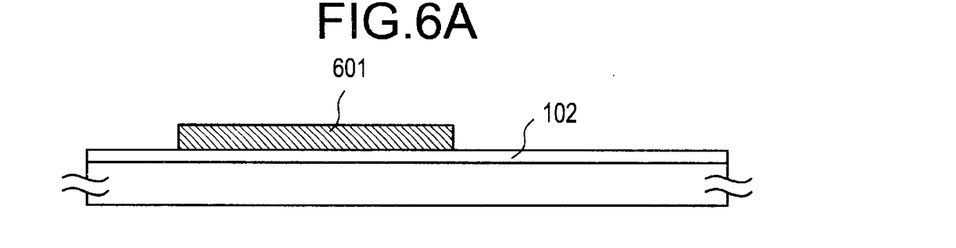
FIGS. 6(A)–6(D) are cross-sectional views of TFTs of Example 5 of the invention, illustrating the process sequence for fabricating the TFTs.
Figure 6B:
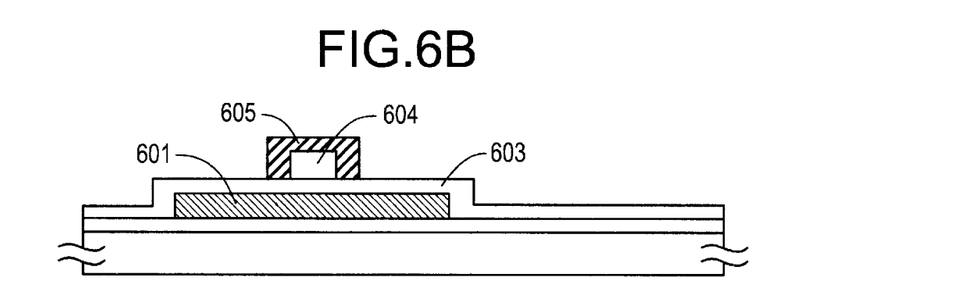
Figure 6C:
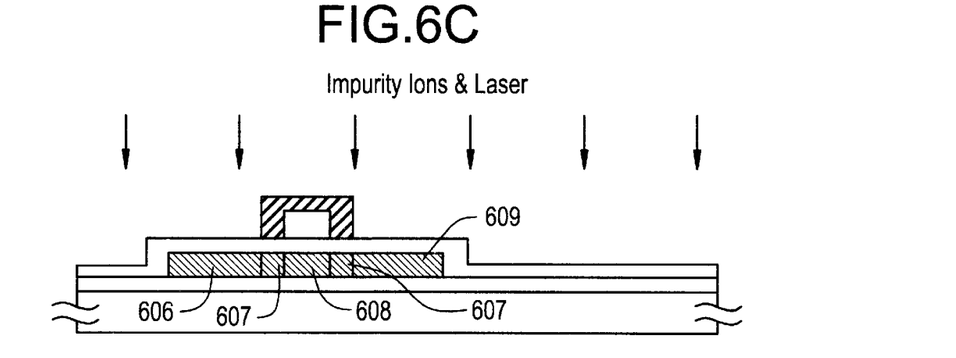

Under this condition, the region which is located immediately under the nickel silicide and heavily doped with nickel is removed. Consequently, the nickel concentration in the active layer can be lowered.

Then, a silicon oxide film 603 which will become a gate-insulating film is formed to a thickness of 1000 Å by plasma-assisted CVD. A film consisting principally of aluminum and containing scandium is formed to a thickness of 6000 Å by electron-beam evaporation. This film is patterned to form gate electrodes 604. In an electrolytic solution, an anodic oxidation process is performed, using the gate electrodes 309 as anodes. In this way, an oxide layer 311 is formed around each gate electrode 604. This oxide layer 605 will act as a mask in an ion implantation step conducted later, and is used to form offset regions. The thickness of the oxide layer 311 is on the order of 2000 Å (FIG. 6(B)).

Thereafter, impurity ions are implanted. In this example, phosphorus ions are implanted by ion doping techniques to introduce phosphorus ions into regions 606 and 609. At this step, the source region 606 and the drain region 609 are formed by self-aligned techniques. At the same time, a channel formation region 608 and an offset region 607 are formed by self-aligned techniques (FIG. 6(C)).

Figure 6D:
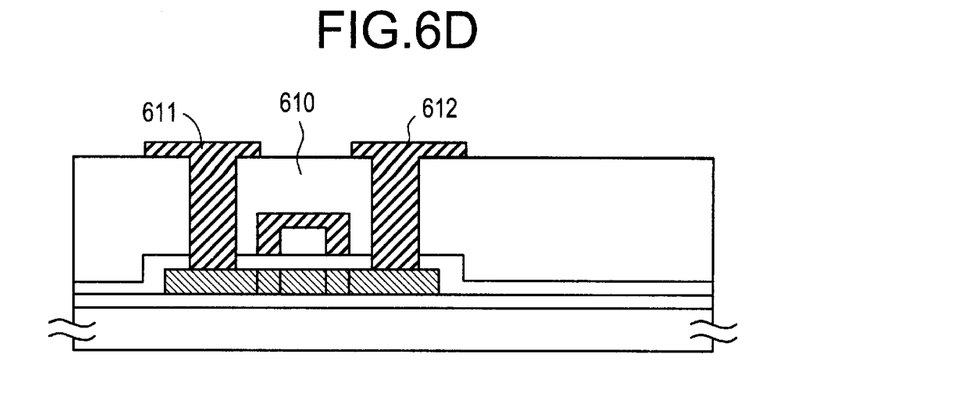

The laminate is annealed by irradiation of laser light or other intense light. The silicon oxide film 603 is formed as an interlayer insulating film to a thickness of 6000 Å. Contact holes are formed in the silicon oxide film 603. Source electrodes 611 and drain electrodes 612 are formed from aluminum.

In the TFTs described in the present example, each active layer is formed so as to avoid the region in which a metal element for promoting crystallization of silicon is introduced. Therefore, the operation of the TFTs is less affected by the metal element. In particular, the active layer is formed so as to circumvent the region in which the silicide layer of the metal for promoting crystallization of crystal nuclei is formed during crystal growth. In consequence, regions heavily doped with the metal element do not exist in the active layer.

EXAMPLE 6

In the present example, an amorphous silicon film is plasma-processed to promote dehydrogenation of the amorphous silicon film. This accelerates crystallization of the amorphous silicon film.

At the step of FIG. 1(D), an amorphous silicon film 108 is processed with a hydrogen plasma. This plasma is obtained by subjecting hydrogen gas to electron cyclotron resonance (ECR) at a reduced pressure. Then, the amorphous silicon film is exposed to the hydrogen plasma.

During the hydrogen plasma processing, it is important that the amorphous silicon film be heated below the crystallization temperature. The crystallization temperature of the amorphous silicon film differs, depending on the method of forming the film and on the conditions under which the film is formed. Generally, the appropriate temperature range is from 600° C. to 650° C. The lower limit of the temperature is about 400° C. Accordingly, the heating temperature range is preferably from 400 to 600° C.

It is advantageous to use the strain point of the glass substrate as a measure in determining the upper limit of the heating temperature. Specifically, the strain point of the glass substrate is used as the upper limit of the temperature. The heating is done at the highest temperature achievable. If this method is exploited, the effects of the deformation and shrinkage of the glass substrate are suppressed and so desired effects can be derived.

When processing using the hydrogen plasma is carried out, hydrogen inside the amorphous silicon film is bonded with hydrogen ions within the plasma, thus producing hydrogen gas. As a result, release of hydrogen from the film is promoted. Also, bonding of silicon atoms is accelerated. As a consequence, the orderliness of the array of atoms can be enhanced. This may be referred to as a quasi-crystalline state. It is quite easy to crystallize the film.

After the plasma processing, energy is imparted to the amorphous silicon film by heating or laser irradiation. In this way, the amorphous silicon film can be crystallized. Since the amorphous silicon film has been made highly crystallizable by the laser processing, the crystallization can be performed with very high reproducibility. In addition, the crystallinity can be made very high.

EXAMPLE 7

In the present example, a layer containing or consisting of a metal element for promoting silicon crystal growth is selectively formed on a substrate having an insulating surface. Then, an amorphous silicon film is formed, followed by laser irradiation to grow crystals. In this way, monodomain regions are selectively formed.

FIGS. 7(A)–7(F) illustrate the process sequence of the present example. First, a silicon oxide film is formed as a buffer film 702 to a thickness of 3000 Å on a glass substrate 701 by sputtering techniques. This buffer film 702 acts as a barrier layer against alkali ions and impurities diffusing out of the glass substrate 701. The buffer film 702 can be made from any desired material as long as it forms an insulating film and serves as a barrier. For instance, a silicon nitride film can be used.

Then, a solution 703 containing nickel which is a metal element for promoting crystallization of silicon is applied, using a spinner 700. That is, the buffer film 702 is spin-coated with the solution. The amount of the nickel element added can be adjusted by controlling the amount of the nickel in the solution 703. In this example, nickel acetate solution is used as the solution 703 containing nickel. In this way, nickel is introduced into the whole surface of the buffer film 702. In other words, nickel is in contact with the whole surface of the buffer film 702 (FIG. 7(A)).

In this example, the solution is employed to introduce nickel. Alternatively, a layer consisting of or containing nickel may be formed on the surface of the buffer film 702 by sputtering, CVD, or evaporation.

Then, the laminate is baked at a temperature of 100 to 400° C. (300° C. in this example) to form a layer 704 consisting of or containing nickel on the surface of the buffer film 702. It is difficult to observe this layer 704 as a thin film. However, we consider that nickel is dispersed or diffused in the surface of the buffer film 702 (FIG. 7(B)).

Subsequently, the layer 704 consisting of or containing nickel is photolithographically patterned to form regions 705 and 706 which will become nuclei during crystal growth (FIG. 7(C)).

Then, an amorphous silicon film 707 is formed to a thickness of 500 Å by plasma-assisted CVD or LPCVD (FIG. 7(D)).

After obtaining the state shown in FIG. 7(D), the laminate is irradiated with laser light while heating it at a temperature of 450 to 600° C. The upper limit of this temperature is determined by the maximum processing temperature of the substrate. At this manufacturing step, crystals are grown as indicated by 708 and 709 from the portions 705 and 706 which will act as nuclei during crystal growth (FIG. 7(E)).

Figure 7F:
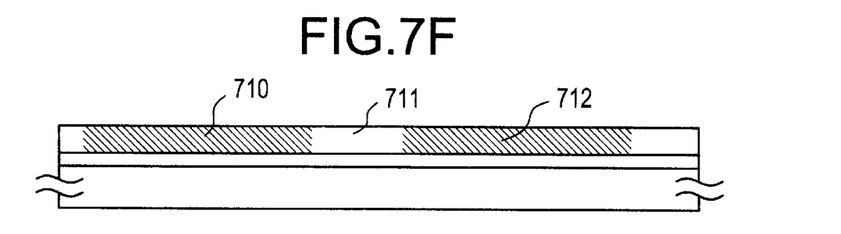

In this way, monodomain regions 710 and 712 which can be regarded as single crystals as shown in FIG. 7(F) are obtained. In FIG. 7(F), indicated by 711 is a region which is left as an amorphous region.

EXAMPLE 8

In the present example, when monodomain regions are formed, active layers of TFTs are formed so as to avoid nickel silicide regions which will become crystal nuclei. Thus, TFTs which are little affected by nickel element are offered.

FIGS. 8(A)–8(F) illustrate the process sequence for fabricating TFTs described in the present example. First, a buffer film 702 is formed on a glass substrate 701. A solution 703 containing nickel (nickel acetate solution) is applied to the buffer film 702 by a spinner 700 by the method described in Example 1 (FIG. 8(A)).

Figure 8A:
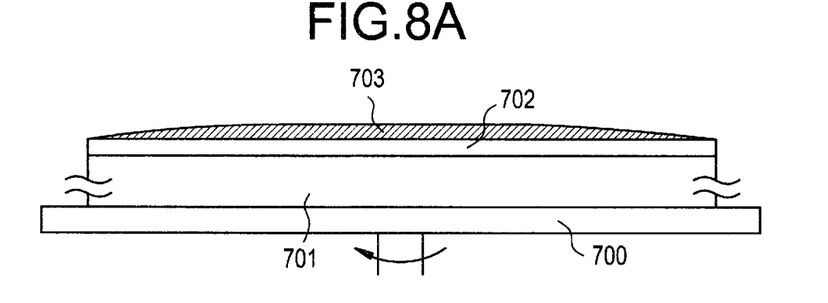
FIGS. 8(A)–8(F) are cross-sectional views of TFTs of Example 8 of the invention, illustrating the process sequence for fabricating the TFTs.
Figure 8B:
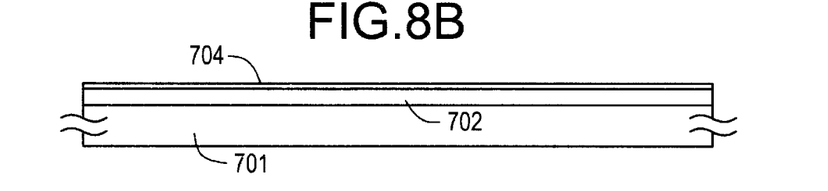
Figure 8C:
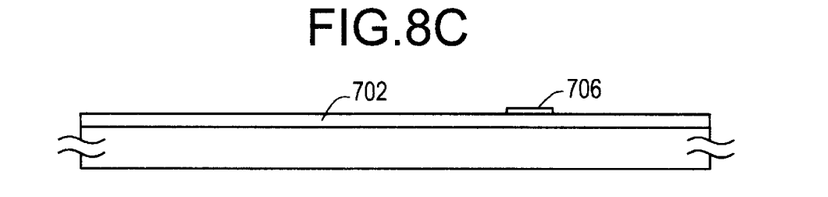
Figure 8D:
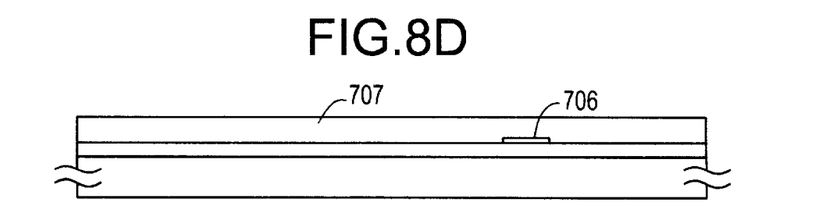

Then, the laminate is heat-treated at 400° C. for 1 hour to form a layer 704 containing nickel (FIG. 8(B)). The laminate is patterned to selectively leave a nickel silicide layer 706 which will become crystal nuclei (FIG. 8(C)). Thereafter, an amorphous silicon film 707 is formed to a thickness of 500 Å by plasma-assisted CVD or LPCVD (FIG. 8(D)).

Figure 8E:
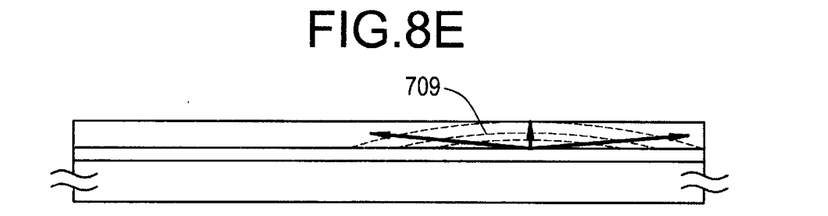
Figure 8F:
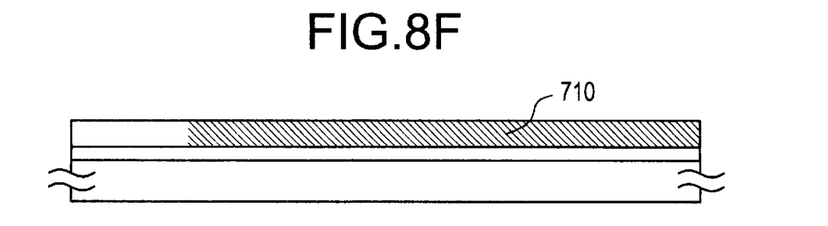

Then, the laminate is irradiated with laser light while heating the laminate at a temperature of 550° C. to grow crystals as indicated by 709 (FIG. 8(E)). In this way, a monodomain region 710 is formed (FIG. 8(F)). The region is patterned to form an active layer 601 while avoiding the region where the nickel silicide layer 706 is formed, as shown in FIG. 6(A). Under this condition, the region which is located immediately under the nickel silicide and heavily doped with nickel is removed. Consequently, the nickel concentration in the active layer can be lowered.

In the TFTs described in the present example, each active layer is formed so as to avoid the region in which a metal element for promoting crystallization of silicon is introduced. Therefore, the operation of the TFTs is hardly affected by the metal element. In particular, the active layer is formed so as to circumvent the region in which the silicide layer of the metal for promoting crystallization of crystal nuclei is formed during crystal growth. In consequence, regions heavily doped with the metal element do not exist in the active layer.

More specifically, TFTs which can be operated at high speeds stably can be obtained. The threshold values of these TFTs do not vary. Also, it is unlikely that their characteristics are changed by aging effects. Furthermore, their OFF current is small. Moreover, they can handle large currents.

In the first through third embodiments of the method of fabricating semiconductor devices in accordance with the present invention, an amorphous silicon film which is formed over a substrate having an insulating substrate is crystallized by the action of a metal element that promotes crystallization of silicon. The crystallized silicon film is patterned to form regions which will act as crystal nuclei at a crystal growth step conducted later. The crystal nuclei are covered with an amorphous silicon film. Crystals are grown from the crystal nuclei. Consequently, it is possible to form monodomain regions.

In the fourth through seventh embodiments of the method of fabricating semiconductor devices in accordance with the present invention, a layer consisting of or containing a metal element for promoting crystallization of silicon is selectively formed on the surface of an insulating surface on which an amorphous silicon film will be formed. Then, this amorphous silicon film is formed. Thereafter, the laminate is irradiated with laser light while heating the laminate. In consequence, monodomain regions substantially free from crystal grain boundaries can be formed.

Therefore, TFTs having characteristics comparable to those of transistors using single-crystal silicon can be fabricated, using the above-described monodomain regions. Specifically, stable high-speed operation is enabled. Their threshold values do not vary. Also, it is unlikely that their characteristics are changed by aging effects. Furthermore, their OFF current is small. In addition, they can handle large ON currents.

What is claimed is:

1. A method of fabricating a semiconductor device, comprising the steps of:

forming a first film comprising amorphous silicon over a substrate having an insulating surface;

maintaining a metal containing layer for promoting crystallization of silicon in contact with said first film;

heat-treating said first film to crystallize same with the aid of said metal containing layer;

patterning the crystallized film into at least one crystal nucleus;

forming a second film comprising amorphous silicon over said substrate with a portion of said second film being in contact with said at least one crystal nucleus; and crystallizing said second film based on said at least one nucleus, and patterning the crystallized second film into at least one active layer for said semiconductor device;

wherein said crystallized second film is so patterned that said portion of the second film is excluded from said active layer.

2. A method of fabricating a semiconductor device, comprising the steps of:

forming a first film comprising amorphous silicon over a substrate having an insulating surface;

maintaining a metal containing layer for promoting crystallization of silicon in contact with said first film;

heat-treating said first film to crystallize [it] same with the aid of said metal containing layer;

patterning the crystallized film into at least one crystal nucleus;

forming a second film comprising amorphous silicon over said substrate with a portion of said second film being in contact with said at least one crystal nucleus; and crystallizing said second film based on said at least one nucleus to form a substantially single crystal region in said second film by light irradiation patterning the crystallized second film into at least one active layer for said semiconductor device; and wherein said crystallized second film is so patterned that said portion of the second film is excluded from said active layer.

3. A method of fabricating a semiconductor device, comprising the steps of:

forming a first film comprising amorphous silicon over a substrate having an insulating surface;

maintaining a metal containing layer for promoting crystallization of silicon in contact with said first film;

heat-treating said first film to crystallize same with the aid of said metal containing layer;

patterning the crystallized film into at least one crystal nucleus;

forming a second film comprising amorphous silicon over said substrate with a portion of said second film being in contact with said at least one crystal nucleus; and crystallizing said second film based on said at least one nucleus by light while heating said second film, wherein said crystallized second film is so patterned that said portion of the second film is excluded from said active layer.

4. A method of fabricating a semiconductor device as set forth in any one of claims 1–3, wherein said metal is selected from the group consisting of Fe, Co, Ni, Ru, Rh, Pd, Os, Ir, Pt, Cu, and Au.

5. A method of fabricating a semiconductor device as set forth in any one of claims 1–3, wherein said metal is selected from the group consisting of Fe, Co, Ni, Ru, Rh, Pd, Os, Ir, Pt, Cu, and Au, and wherein a concentration of said metal in said active layer is from $1\times10^{14}$ to $1\times10^{19}$ atoms cm$^3$.

6. A method of fabricating a semiconductor device as set forth in any one of claims 1–3, wherein said active layer contains 0.001 to 5 atomic % hydrogen or halogen element.

7. A method of fabricating a semiconductor device according to claim 1 wherein said active layer is substantially single crystal which has no grain boundary therein and contains hydrogen to neutralize point defects therein.

8. A method of fabricating a semiconductor device according to claim 7 wherein said grain boundary is a line-defect or a two-dimensional defect.

9. A method of fabricating a semiconductor device according to claim 2 wherein said active layer is substantially single crystal which has no grain boundary therein and contains hydrogen to neutralize point defects therein.

10. A method of fabricating a semiconductor device according to claim 9 wherein said grain boundary is a line-defect or a two-dimensional defect.

11. A method according to claim 2 wherein said light irradiation is a laser irradiation.

12. A method of fabricating a semiconductor device according to claim 3 wherein said active layer is substantially single crystal which has no grain boundary therein and contains hydrogen to neutralize point defects therein.

13. A method of fabricating a semiconductor device according to claim 12 wherein said grain boundary is a line-defect or a two-dimensional defect.

14. A method according to claim 3 wherein said light irradiation is a laser irradiation.

15. A method of fabricating a semiconductor device according to claim 1 wherein said semiconductor device is an active matrix liquid crystal display.

16. A method of fabricating a semiconductor device according to claim 1 further comprising a step of adding impurities to portions of said active layer to form a source region and a drain region.

17. A method of fabricating a semiconductor device according to claim 2 wherein said semiconductor device is an active matrix liquid crystal display.

18. A method of fabricating a semiconductor device according to claim 2 further comprising a step of adding impurities to portions of said active layer to form a source region and a drain region.

19. A method of fabricating a semiconductor device according to claim 3 wherein said semiconductor device is an active matrix liquid crystal display.

20. A method of fabricating a semiconductor device according to claim 3 further comprising a step of adding impurities to portions of said active layer to forma source region and a drain region.

21. A method of manufacturing a semiconductor device comprising the steps of:

forming a first film comprising amorphous silicon over a substrate having an insulating surface;

providing an entirely region of said first film with a catalyst material for promoting crystallization of said first film;

crystallizing said first film with an aid of said catalyst material;

patterning the crystallized first film into at least one crystal nucleus;

forming a second film comprising amorphous silicon over said substrate and said at least one crystal nucleus wherein a portion of the second film contacts said at least one crystal nucleus;

crystallizing said second film from said at least one crystal nucleus;

patterning the crystallized second film into at least one active layer for said semiconductor device;

wherein said crystallized second film is so patterned that said portion of the second film is excluded from said active layer.

22. A method according to claim 21 wherein said catalyst material is formed on an entire upper surface of the first film.

23. A method according to claim 21 wherein said catalyst material comprises a metal.

24. A method according to claim 23 wherein said metal is selected from the group consisting of Fe, Co, Ni, Ru, Rh, Pd, Os, Ir, Pt, Cu and Au.

25. A method to claim 21 wherein the crystallization ofthe second film is conducted by light irradiation.

26. A method according to claim 21 wherein said active layer is substantially single crystal which has no grain boundary therein and contains hydrogen to neutralize point defects therein.

* * * * *